(12) United States Patent
Okamoto et al.

(10) Patent No.: US 7,257,172 B2
(45) Date of Patent: Aug. 14, 2007

(54) SIGNAL PROCESSING DEVICE UTILIZING PARTIAL RESPONSE MAXIMUM LIKELIHOOD DETECTION

(75) Inventors: Yutaka Okamoto, Chofu (JP); Manabu Akamatsu, Ome (JP); Yuji Sakai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 739 days.

(21) Appl. No.: 10/679,150

(22) Filed: Oct. 6, 2003

(65) Prior Publication Data
US 2004/0076245 A1 Apr. 22, 2004

(30) Foreign Application Priority Data
Oct. 17, 2002 (JP) ............................. 2002-303139

(51) Int. Cl.
*H03D 1/00* (2006.01)
*H03L 27/06* (2006.01)

(52) U.S. Cl. .................. 375/341; 375/263; 375/344; 375/345

(58) Field of Classification Search ............... 375/262, 375/263, 340, 341, 344, 345; 714/794, 795; 360/65, 67
See application file for complete search history.

(56) References Cited

U.S. PATENT DOCUMENTS

| | | | |
|---|---|---|---|
| 4,922,437 A | 5/1990 | Sakata et al. | |
| 5,243,471 A | 9/1993 | Shinn | |
| 5,341,249 A | 8/1994 | Abbott et al. | |
| 5,689,532 A * | 11/1997 | Fitzpatrick | 375/341 |
| 5,768,320 A | 6/1998 | Kovacs et al. | |
| 5,825,832 A * | 10/1998 | Benedetto | 375/341 |
| 6,014,411 A | 1/2000 | Wang | |
| 6,023,386 A | 2/2000 | Reed et al. | |

(Continued)

FOREIGN PATENT DOCUMENTS

EP    1 081 868 A2    3/2001

(Continued)

OTHER PUBLICATIONS

Hagenauer et al., "A Viterbi Algorithm with Soft-Decision Outputs and its Applications," German Aerospace Research Establishment, Institute for Communications Technology, 1989, pp. 1680-1686.

(Continued)

*Primary Examiner*—Betsy L. Deppe
(74) *Attorney, Agent, or Firm*—Pillsbury Winthrop Shaw Pittman, LLP

(57) ABSTRACT

A partial response (PR) waveform generator generates a digital value sequence of an expected PR waveform based on the output of a soft-decision Viterbi detector included in, for example, a first-stage decoder unit incorporated in an iterative decoder. The generator also generates flag information indicative of whether reliability of the digital value sequence is low or high, in parallel with the generation of the digital value sequence. An error detector detects error values in a PR equalized sample value sequence, needed for feedback control of a control target, using the digital value sequence of the expected PR waveform as a digital value sequence of a reference waveform. An error output controller controls the output of the error values detected by the error detector in accordance with the state of the flag information generated by the generator.

15 Claims, 9 Drawing Sheets

U.S. PATENT DOCUMENTS

| | | | |
|---|---|---|---|
| 6,023,783 | A | 2/2000 | Divsalar et al. |
| 6,108,388 | A | 8/2000 | Douillard et al. |
| 6,198,587 | B1 * | 3/2001 | Hayashi ............... 360/65 |
| 6,249,398 | B1 | 6/2001 | Fisher et al. |
| 6,304,985 | B1 | 10/2001 | Sindhushayanna et al. |
| 6,334,197 | B1 | 12/2001 | Eroz et al. |
| 6,549,354 | B1 * | 4/2003 | Ashley et al. .......... 360/46 |
| 7,113,555 | B2 * | 9/2006 | Campello de Souza et al. . 375/341 |
| 2003/0161062 | A1 | 8/2003 | Akamatsu |
| 2003/0174426 | A1 | 9/2003 | Akamatsu |
| 2004/0061964 | A1 | 4/2004 | Akamatsu |

FOREIGN PATENT DOCUMENTS

| | | |
|---|---|---|
| JP | 10-255402 | 9/1998 |
| JP | 2001-211411 | 8/2001 |
| JP | 2001-344903 | 12/2001 |
| JP | 5-128742 | 6/2002 |
| JP | 3318937 | 6/2002 |
| JP | 2002-198827 | 7/2002 |

OTHER PUBLICATIONS

Yeo et al., "VLSI Architectures for Iterative Decoders in Magnetic Recording Channels," IEEE Transactions of Magnetics, vol. 37, No. 2, Mar. 2001, pp. 748-755.

Isaka et al., "A tutorial on "parallel concatenated (Turbo) coding," "Turbo (iterative) decoding" and related topics," The Institute of Electronics, Technical Report of IEICE, 1998, pp. 1-18.

Search and Examination Reports, mailed Feb. 16, 2004, from the Australian Patent Office for Patent Application No. SG 200305558-9.

Wu, Zining, "Coding and Iterative Detection for Magnectic Recording Channels," The Kluwer International Series in Engineering and Computer Science, Kluwer Academic Publishers, 2000, pp. 21-46.

* cited by examiner

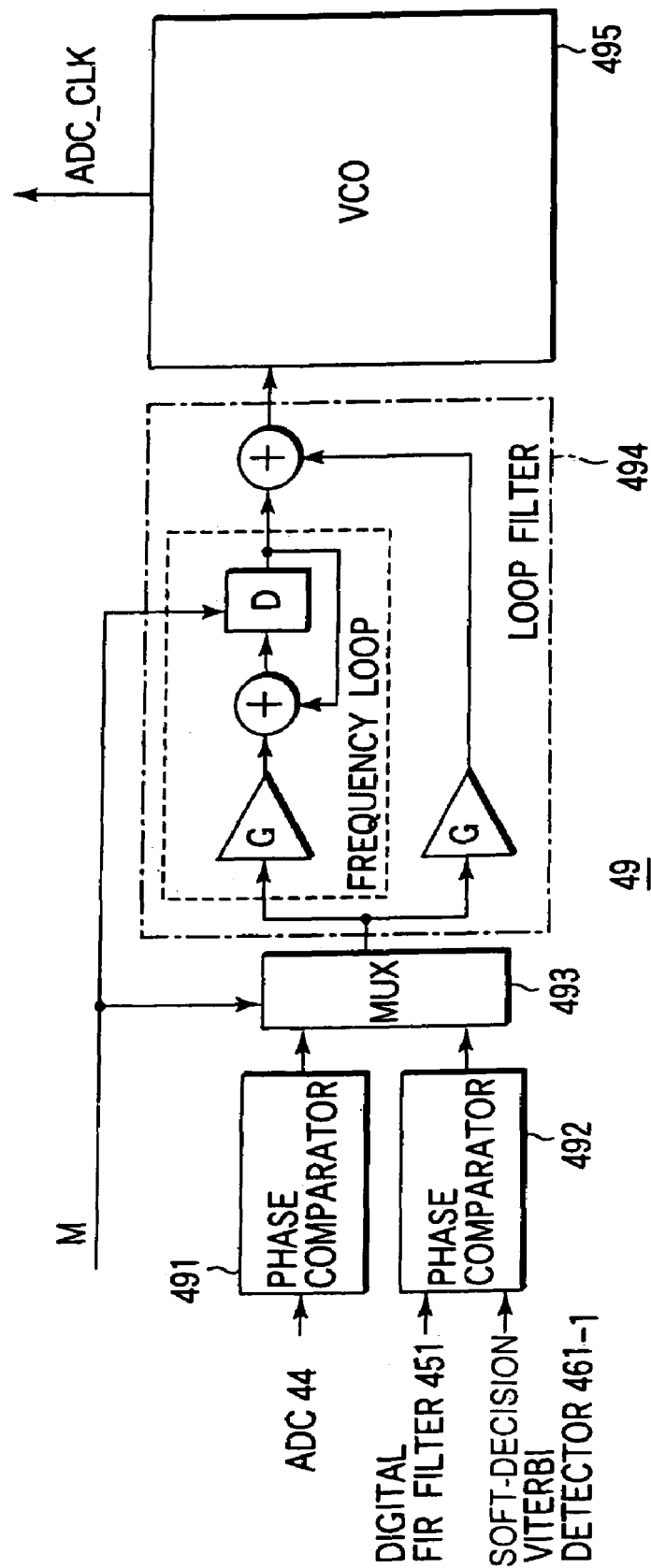
F I G. 10

SIGNAL PROCESSING DEVICE UTILIZING PARTIAL RESPONSE MAXIMUM LIKELIHOOD DETECTION

CROSS-REFERENCE TO RELATED APPLICATIONS

This application is based upon and claims the benefit of priority from the prior Japanese Patent Application No. 2002-303139, filed Oct. 17, 2002, the entire contents of which are incorporated herein by reference.

BACKGROUND OF THE INVENTION

1. Field of the Invention

The present invention relates to a disk drive using a disk as a recording medium, and more particularly to a signal processing device which is suitable for feedback control based on soft-decision values output from a soft-decision Viterbi detector incorporated in an iterative decoder, and which utilizes partial response maximum likelihood detection.

2. Description of the Related Art

Magnetic disk drives (HDDs) as typical disk drives utilizing disks as recording mediums are known. As described in, for example, U.S. Pat. Nos. 5,341,249 and 6,249,398, signal processing devices for use in recent magnetic disk drives utilize digital signal processing called "partial response maximum likelihood (PRML) detection". In the signal processing devices described in these documents, write data is encoded into a run length limited (RLL) code. The encoded data is recorded on a disk with the timing of the recorded waveform corrected. The data recorded on the disk is read by a head. The read data or signal is amplified by a read amplifier (pre-amplifier). The amplified analog signal (read signal) is input to a variable gain amplifier. The variable gain amplifier is controlled so as to make the amplitude of the read signal constant. The read signal output from the variable gain amplifier is input to an A/D converter via an analog filter. The A/D converter converts the read signal into a quantized discrete-time sample-value sequence in synchrony with a sampling clock (read clock). This sample value sequence is equalized toward a desired response by a digital FIR (Finite Impulse Response) filter. The equalized sample value sequence is detected as a binary sequence by a Viterbi detector. The detected binary sequence is decoded by a decoder (channel code decoder) into data identical to the data written to the disk.

The signal processing devices perform feedback control for adjusting the gain of the variable gain amplifier to make the amplitude of a read signal constant. They also perform feedback control for timing adjustment (timing recovery) of a sampling clock for the A/D converter, and feedback control for adaptive control of the FIR filter. Concerning these feedback control processes, see, for example, Jpn. Pat. Appln. KOKAI Publication No. 2001-344903, as well as the above-mentioned documents. In the feedback control disclosed in Jpn. Pat. Appln. KOKAI Publication No. 2001-344903, a system (ideal PR (partial Response) system) equivalent to the FIR filter generates a digital value sequence of a waveform equalized in an expected response (i.e., an expected PR value sequence). More specifically, an expected PR value sequence is generated by convolution integration of a binary sequence (hard-decision values) as the output of the Viterbi detector, and PR values determined from predetermined PR parameters (7, 4, −4, −5, −2). The expected PR value sequence is used as a reference PR value sequence, and compared with the output of the FIR filter, i.e., an actual sample value sequence of a PR waveform (PR equalized waveform), thereby detecting error values for each target subjected to feedback control. On the basis of the detected error values, each target is feedback-controlled.

In recent magnetic disk drives, a signal processing technique utilizing turbo coding and iterative decoding has come to be employed to compensate for reduction of an S/N ratio (signal-to-noise ratio) caused in accordance with increases in the recording density of the disk drives. This signal processing technique is described in J. Hagenauer and P. Hoeher, "A Viterbi Algorithm with Soft-Decision Outputs and its Applications" (Proc. of IEEE Globecom, p. 1680-1689, 1989) (hereinafter referred to as "document 1"), P. Pakzad, B. Nikolic and V. Anantharam, "VLSI Architectures for Iterative Decoders in Magnetic Recording Channels" (IEEE Trans. Magn., Vol. 37, No. 2, p. 748-751, March 2001), and M. Isaka and H. Imai, "A tutorial on "parallel concatenated (Turbo) coding", "Turbo (iterative) decoding" and related topics", TECHNICAL REPORT OF IEICE, IT98-51, P.7-11, December 1998) (hereinafter referred to as "document 2"). The signal processing technique is also described in U.S. Pat. No. 6,108,388 (hereinafter referred to as "document 3"). Decoders for iterative decoding are called iterative decoders. An iterative decoder comprises a soft-decision Viterbi decoder (inner code decoder), de-interleaver and outer code decoder. Unlike standard Viterbi detectors, the soft-decision Viterbi detector outputs soft-decision values (outer codes) instead of a binary sequence (hard-decision values). The soft-decision values represent likelihood information that indicates the reliability of each bit forming the binary sequence. The soft-decision outputs of the soft-decision Viterbi detector are input to the outer code decoder via the de-interleaver, and are again decoded by it. The iterative decoder iterates decoding of a sample value sequence (inner codes) indicative of a PR equalized waveform, using the soft-decision Viterbi detector, and decoding of outer codes using the outer code decoder. As a result of iteration of decoding, the rate of errors that occur when data is read from a disk is reduced. The iterative decoder compares, with a threshold value, the soft-decision values obtained after the iteration of decoding, thereby outputting hard-decision values (binary sequence).

However, the iteration of decoding utilizing both the soft-decision Viterbi decoder (inner code decoder) and outer code decoder involves a data time delay. The time delay of data is a problem in a disk drive that is required to show a high throughput. To overcome this, magnetic disk drives utilizing turbo coding and iterative decoding employ an iterative decoder of a pipeline or cascade structure, as described in the documents 1 and 3. Further, documents 1 and 2 describe a Viterbi algorithm called "SOVA (Soft Output Viterbi Algorithm)" (soft-decision Viterbi detector) as a Viterbi algorithm (Viterbi detector) used in an iterative decoder. SOVA comprises only forward iterative processing, and does not need backward iterative processing performed after each forward iterative processing. Accordingly, the SOVA shows a low detection performance because of its approximate calculation, but does not require a large memory capacity and hence causes only a short data time delay.

As described above, in conventional disk drives, a PR value sequence of a reference PR waveform needed for feedback control of a predetermined control target is generated on the basis of a binary sequence (hard-decision values) as the output of a Viterbi detector. On the other hand, in disk drives utilizing iterative decoding, an iterative decoder (turbo decoder) iterates decoding (detection) of a sample value sequence of a PR equalized waveform (inner codes) utilizing an inner code decoder (soft-decision Viterbi detector), and decoding of outer codes utilizing an outer code decoder, thereby reducing the error rate.

Therefore, to perform the above-described feedback control, the disk drives utilizing iterative decoding require the Viterbi output obtained after decoding iteration to have a low error count, i.e., the output (soft-decision values) of the iterative decoder, as a Viterbi output for generating a PR value sequence of a reference PR waveform (a digital value sequence of a reference PR waveform). However, if the output of an iterative decoder is used, a large time delay occurs due to feedback control.

BRIEF SUMMARY OF THE INVENTION

According to an embodiment of the invention, there is provided a signal processing device utilizing partial response maximum likelihood detection. The signal processing device comprises an iterative decoder, partial response waveform generator, flag generator, error detector and error output controller. The iterative decoder detects a signal from a partial response equalized sample value sequence, utilizing iterative decoding. The iterative decoder has a plurality of cascade-connected decoder units. Each decoder unit includes a soft-decision Viterbi detector which outputs soft-decision values from a sample value sequence input to each of the decoder units. The partial response waveform generator generates a digital value sequence of an expected partial response waveform based on an output of the soft-decision Viterbi detector included in a predetermined one of the decoder units, the predetermined decoder unit being other than a final-stage decoder unit. The flag generator generates flag information indicative of whether reliability of the digital value sequence generated by the partial response waveform generator is low or high, based on the output of the soft-decision Viterbi detector included in the predetermined decoder unit. The error detector detects error values in the partial response equalized sample value sequence. The error detector utilizes the digital value sequence, generated by the partial response waveform generator, as a digital value sequence of a reference waveform for feedback control of a predetermined control target, the reference waveform being referred to for error value detection. The error output controller controls output of the error values detected by the error detector in accordance with a state of the flag information generated by the flag generator.

BRIEF DESCRIPTION OF THE SEVERAL VIEWS OF THE DRAWING

FIG. 10 is a block diagram illustrating the configuration of the timing recovery controller 49 appearing in FIG. 1;

DETAILED DESCRIPTION OF THE INVENTION

Figure 1:
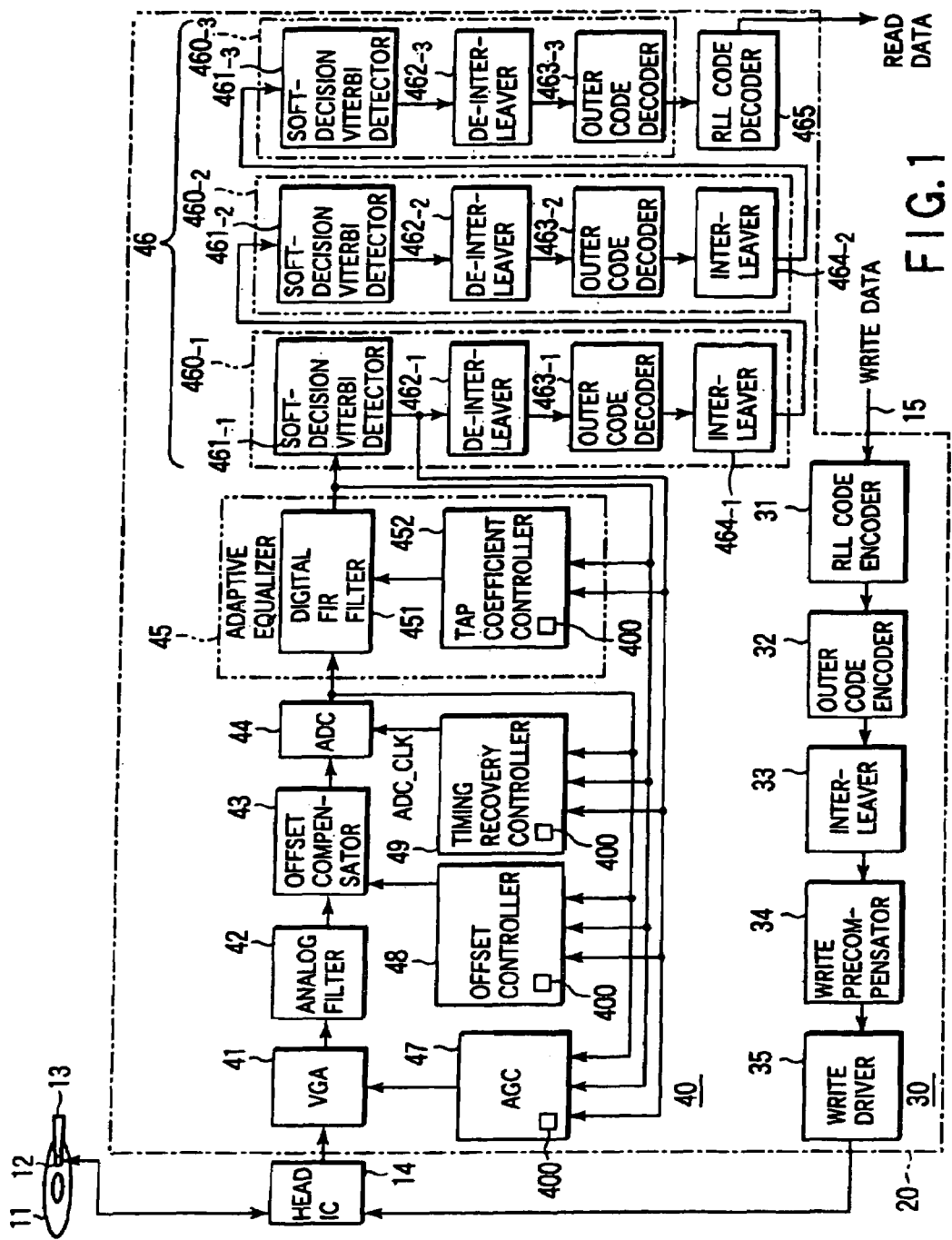
FIG. 1 is a block diagram illustrating the configuration of a magnetic disk drive according to an embodiment of the invention.

A magnetic disk drive according to an embodiment of the invention will be described in detail with reference to the accompanying drawings. FIG. 1 is a block diagram illustrating the configuration of a magnetic disk drive (hereinafter referred to as an "HDD") according to the embodiment of the invention. As seen from FIG. 1, a disk (magnetic disk medium) 11 has two, i.e., upper and lower, disk surfaces. At least one of the two disk surfaces of the disk 11 serves as a recording surface for magnetically recording data. A head (magnetic head) 12 is provided corresponding to the recording surface of the disk 11. The head 12 is used to write data to the disk 11 (data recording), and read data therefrom (data reproduction).

The disk 11 is rotated at a high speed by a spindle motor (not shown). The head 12 is attached to the distal end of an actuator (carriage) 13. In accordance with the rotation of the actuator 13, the head 12 is radially moved over the disk 11. As a result, the head 12 is positioned above a target track. FIG. 1 shows only one head 12, for simplicity. In general, however, both surfaces of the disk 11 are recording surfaces, and respective heads are provided for the recording surfaces. Further, in FIG. 1, the HDD is equipped with a single disk 11. However, a plurality of disks 11 may be incorporated in the HDD.

The head 12 is connected to a head IC (Integrated Circuit) 14 forming a head amplifier circuit. The head IC 14 incorporates a read amplifier (not shown) for amplifying a read signal read by the head 12, and a write amplifier (not shown) for converting write data into a write current. The head IC 14 is connected to a read/write IC (read/write channel) 20. The read/write IC 20 is a signal processing device for performing various types of processing, such as A/D (Analog/Digital) conversion of a read signal, decoding of write data, encoding of read data, etc.

The read/write IC 20 is one IC chip, equipped with a write channel 30 and read channel 40. The write channel 30 comprises an RLL code encoder 31, outer code encoder 32, interleaver 33, write precompensator 34 and write driver 35. The RLL code encoder 31 is connected to a signal line 15 for transferring write data. The read channel 40 comprises a variable gain amplifier (VGA) 41, analog filter 42, offset compensator 43, A/D (Analog/Digital) converter (ADC) 44, adaptive equalizer 45, iterative decoder 46, automatic gain controller (AGC) 47, offset controller 48 and timing recovery controller 49.

The adaptive equalizer 45 comprises a filter 451 and tap coefficient controller 452. The iterative decoder 46 comprises a plurality of (e.g. three) decoder units 460-1, 460-2 and 460-3, and RLL code decoder 465. The input of the RLL code decoder 465 is connected to the output of the last-stage decoder unit 460-3. The decoder units 460-1 and 460-2 comprise soft-decision Viterbi detectors 461-1 and 461-2, de-interleavers 462-1 and 462-2, outer code decoders 463-1 and 463-2 and interleavers 464-1 and 464-2, respectively. On the other hand, the decoder unit 460-3 comprises a soft decision Viterbi detector 461-3, de-interleaver 462-3 and outer code decoder 463-3.

In the HDD shown in FIG. 1, write data transferred from a host, such as a personal computer, which utilizes the HDD, is input to the write channel 30 via the signal line 15. This write data is encoded, by the RLL code encoder 31 in the write channel 30, into an RLL (Run Length Limited) code as a channel recording code in accordance with the RLL constraint. The encoded data, i.e., encoded binary sequence, is further encoded by the outer code encoder 32 and rearranged by the interleaver 33. The number of bits with a binary value of 1 included in a code, is called a "weight". The interleaver 33 rearranges encoded data as input data (input code sequence), and outputs a code sequence having a greater weight than the input code sequence, i.e., outputs a code sequence with a few codes of light weights. The write precompensator 34 corrects the timing of writing of the encoded binary sequence output from the interleaver 33 when the head 12 writes data to the disk 11. The encoded binary sequence obtained after the timing correction is output as write data by the write driver 35 to the head IC 14. The head IC 14 converts, into a write current, the write data output from the write driver 35, and outputs the current to the head 12. Thus, the encoded data corresponding to the write current is written by the head 12 to the disk 11.

On the other hand, the data written to the disk 11 is read by the head 12 and amplified by the head IC 14. The amplified analog signal (read signal) is input to the variable gain amplifier 41 incorporated in the read channel 40. The variable gain amplifier 41 is feedback-controlled by the automatic gain controller 47 so that it suppresses variations in the amplitude of a read signal to maintain the signal amplitude constant. Variations in the floating amount of the head 12, variations in the writing conditions, etc. are known as factors that change the amplitude of a read signal. The read signal output from the variable gain amplifier 41 is input to the analog filter 42. The analog filter 42 is used for processing performed before the read signal is quantized by the A/D converter 44. The analog filter 42 is a low-pass filter for filtering a read signal, and is used to limit the noise band of a read signal (i.e., eliminate noise) and equalize the waveform of the read signal toward a desired response. The read signal filtered by the analog filter 42 is input to the offset compensator 43. In general, the read signal input to the offset compensator 43 is offset, i.e., has its zero level (center level) deviated. A shift of the base line due to suppression of the low-frequency component of a read signal is known as a factor of the offset. Further, deviation of the zero level of the head IC 14, variable gain amplifier 41, analog filter 42, offset compensator 43 or A/D converter 44 is known as another factor of the offset. The offset compensator 43 corrects the zero level of an input signal under the feedback control of the offset controller 48.

The signal output from the offset compensator 43 is input to the A/D converter 44. The A/D converter 44 converts the input signal (read signal) into a quantized discrete-time sample-value sequence in synchrony with a sampling clock (read clock) ADC_CLK. The sampling clock ADC_CLK used for sampling (quantization) of a read signal is supplied from the timing recovery controller 49. The timing recovery controller 49 makes the clock ADC_CLK synchronous with the clock (channel clock) of the data written to the disk 11.

The sample value sequence of the read signal quantized by the A/D converter 44 is equalized toward a desired response by the digital FIR filter 451 of the adaptive equalizer 45. The FIR filter 451 utilizes adaptive equalization. Under the feedback control of the tap coefficient controller 452, the FIR filter 451 can dynamically update the tap coefficient (tap weight coefficient). The sample value sequence PR-equalized by the FIR filter 451 is input to the iterative decoder 46. The iterative decoder 46 decodes the output of the FIR filter 451 into data identical to the data written to the disk 11.

Firstly, the sample value sequence PR-equalized by the FIR filter 451 is input to the soft-decision Viterbi detector 461-1 incorporated in the first-stage decoder unit 460-1 of the iterative decoder 46. The soft-decision Viterbi detector 461-1 utilizes maximum posteriori probability decoding to generate soft-decision values from the input sample value sequence (=inner codes). More specifically, concerning each symbol (bit) of a target information sequence (binary sequence), the soft-decision Viterbi detector 461-1 computes the logarithmical ratio (i.e., log-likelihood ratio) of the posteriori probability of an input PR equalized sample value sequence. The soft-decision Viterbi detector 461-1 outputs the logarithmical ratio as a soft-decision value. This soft-decision value is likelihood information indicative of the reliability of a corresponding symbol (bit).

A description will be given of a soft-decision value output from the soft-decision Viterbi detector 461-1, compared to a hard-decision value output from a Viterbi detector that does not utilize iterative decoding (hereinafter referred to as a "hard-decision Viterbi detector").

Firstly, the following conditions are assumed:

Encoding rate K/N

Information sequence uk=(u1, u2, ..., uk, ..., uK): uk={+1, −1}

Encoded binary sequence xk=(x1, x2, ..., xk, ..., xN): xk={+1, −1}

Reception sequence yk=(y1, y2, ..., yN)

Decoding, in which u that makes P(y|xj) (j is an integer that satisfies $1 \leq j \leq 2K$) maximum is estimated as an information sequence, is called "maximum likelihood decoding". Maximum likelihood decoding minimizes block error probability, and is therefore optimal decoding. Hard-decision Viterbi detectors are maximum likelihood decoders (Viterbi decoders) utilizing a Viterbi algorithm for maximum likelihood decoding (maximum likelihood determination). The output of the hard-decision Viterbi decoder is u={+1, −1}, binary data.

On the other hand, the soft-decision Viterbi detector 461-1 used for iterative decoding utilizes maximum posteriori probability decoding that minimizes the symbol error rate. In maximum posteriori probability decoding, the information symbol uk (k is an integer that satisfies $1 \leq k \leq K$) that makes P(uk|y) maximum is output as a decoding result. To this end, the soft-decision Viterbi detector 461-1 computes the log-likelihood ratio of posteriori probability P(uk|y), $$L(uk|y)=\ln \{P(uk=+1|y)/P(uk=-1|y)\}$$

The soft-decision Viterbi detector 461-1 estimates that if L(uk|y)>0, uk=+1, whereas if L(uk|y)<0, uk=−1. Further, if L(uk|y)=0, the same probability is obtained irrespective of whether uk=+1 or uk=−1. In other words, the reliability is lowest.

As described above, the soft-decision Viterbi detector 461-1 utilizes approximation to compute the log-likelihood ratio in maximum posteriori probability decoding. The soft-decision Viterbi detector 461-1 outputs not only a decoding determination value, but also an approximated log-likelihood ratio as a soft output value (soft-decision value indicative of reliability). The soft-decision Viterbi detector 461-1 utilizes the Viterbi algorithm called "SOVA (Soft-Output Viterbi Algorithm)", disclosed in the previously mentioned document 1, as an algorithm used for computing the soft output value (log-likelihood ratio). The soft-decision Viterbi detectors 461-2 and 461-3 in the decoder units 460-2 and 460-3 perform the same operation as the above.

In the decoder unit 460-1, the output (soft-decision value) of the soft-decision Viterbi detector 461-1 is input to the de-interleaver 462-1. The de-interleaver 462-1 returns, to the original one, the arrangement of the codes interleaved at the write channel 30 side. The output of the de-interleaver 462-1 is input to the outer code decoder 463-1. The outer code decoder 463-1 is a soft-input soft-output decoder. In this embodiment, the outer coder decoder 463-1 comprises a soft-decision Viterbi detector having the same structure as the soft-decision Viterbi detector 461-1. However, the outer code decoder 463-1 can also be formed of a soft-decision Viterbi detector having a structure different from that of the soft-decision Viterbi detector 461-1.

In iterative decoding performed by the iterative decoder 46, a long code of a high decoding complexity is decomposed and decoded by the soft-decision Viterbi detector 461-i (i=1 to 3) and outer code decoder 463-i. The soft-decision Viterbi detector 461-i is a decoder for codes of a low complexity. The interaction of iterative decoding by the soft-decision Viterbi detector 461-i and outer code decoder 463-i can successively reduce the error rate.

The output of the outer code decoder 463-1 in the decoder unit 460-1 is input to the next decoder unit 460-2 via the interleaver 464-1, where it is again decoded. Similarly, the output of the decoder unit 460-2 is input to the last decoder unit 460-3, where it is further decoded. Thus, iterative decoding is repeated in the decoder units 460-1 to 460-3, thereby reducing the error rate. The output of the decoder unit 460-3 is RLL-encoded binary data and the last hard-decision value of iterative decoding. The output of the decoder unit 460-3 is input to the RLL code decoder 465. The RLL code decoder 465 decodes the RLL-encoded binary data (the final hard-decision value of iterative decoding) as the output of the decoder unit 460-3, into binary data identical to that written to the disk 11, i.e., write data.

The gain of the variable gain amplifier 41 (the signal amplitude adjusted by the variable gain amplifier 41) is feedback-controlled by the automatic gain controller 47. The compensation by the offset compensator 43 (the signal offset compensated by the compensator 43) is feedback-controlled by the offset controller 48. The timing of the sampling clock ADC_CLK used in the A/D converter 44 is feedback-controlled by the timing recovery controller 49. The equalization characteristic of the FIR filter 451 is feedback-controlled by the tap coefficient controller 452. In other words, the tap coefficient controller 452 functions as an equalization characteristic controller for feedback-controlling the equalization characteristic of the FIR filer 451. For this feedback control, soft-decision values generated by the iterative decoder 46 are utilized. The automatic gain controller 47, offset controller 48, timing recovery controller 49 and tap coefficient controller 452 each contain a PR waveform generator 400, described later, which generates a digital value sequence (PR value sequence) of a PR waveform (reference PR waveform) expected from the soft-decision values.

In this embodiment, the output of the soft-decision Viterbi detector 461-1 provided in the first-stage decoder unit 460-1 of the iterative decoder 46, i.e., a Viterbi output generated before iteration of decoding, is used as a soft-decision value for the above-described feedback control. Alternatively, the output of the soft-decision Viterbi detector 461 of a decoder unit 460 other than the decoder unit 460-1, for example, the second-stage decoder unit 460-2, i.e., a Viterbi output generated during iteration of decoding, may be used as a soft-decision value for the above-described feedback control. However, the output of the soft-decision Viterbi detector 461-3 of the last-stage decoder unit 460-3 is not suitable for feedback control since the time delay of this output is as long as that of the output of the iterative decoder 46. As is apparent, the time delay is shortest when the output of the soft-decision Viterbi detector 461-1, which is included in the Viterbi detectors 461-1 to 461-3 of all the decoder units 460-1 to 460-3, is used for feedback control. In other words, when the output of the soft-decision Viterbi detector 461-1 is utilized, feedback control is fastest. It should be noted that in the embodiment, feedback control is performed, not based on a hard-decision value (binary data) output from the iterative decoder 46, but based on a soft-decision value generated in the iterative decoder 46.

Figure 2:
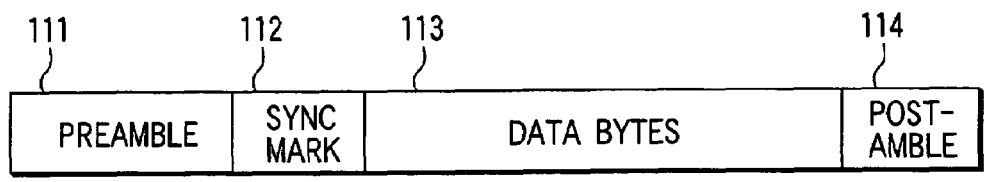
FIG. 2 is a schematic illustrating the format of sector data recorded on the disk 11 appearing in FIG. 1.
Figure 3:
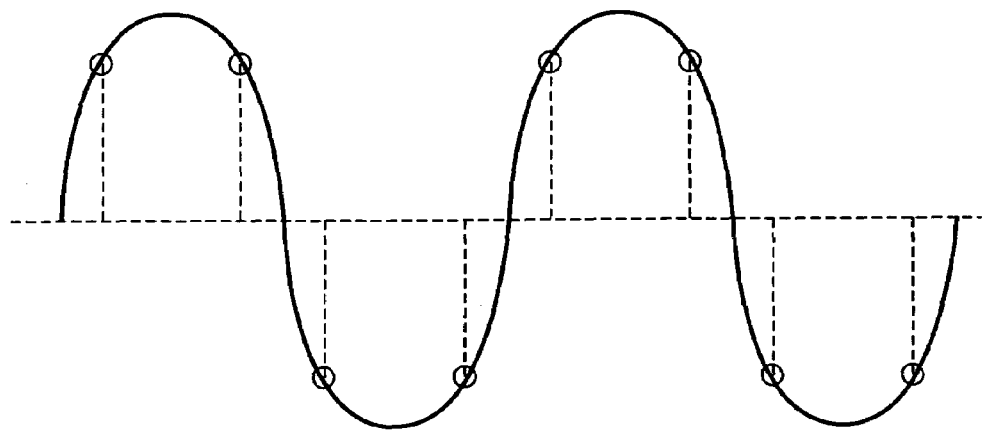
FIG. 3 illustrates an example of the preamble (preamble pattern) 111 appearing in FIG. 2.

FIG. 2 is a schematic illustrating the format of sector data recorded on the disk 11. As seen from FIG. 2, data of one sector (data sector) comprises a preamble 111, SYNC mark 112, data bytes 113 and postamble 114. FIG. 3 shows an example of the preamble (preamble pattern) 111. The preamble 111 shown in FIG. 3 is a pattern of a single frequency for converging the feedback loop at a high speed. The SYNC mark 112 is a particular pattern for synchronizing data in bytes, the data being already synchronized in bits. The data bytes 113 is encoded (channel-encoded) data (user data).

The preamble 111 is generally used for high-speed acquisition of a read signal. Since the preamble 111 has a single frequency as shown in FIG. 3, it does not need equalization. To enhance the response characteristic, the preamble 111 is extracted from the output of the A/D converter 44 and used for detecting error values for feedback control. When the preamble 111 is sampled in synchrony with the channel clock (data clock), it periodically assumes constant values (e.g., +1, +1, −1, −1, +1, +1, . . . ) as marked by dots in FIG. 3. Accordingly, it is sufficient if the preamble pattern is extracted from the output of the A/D converter 44, and it is not necessary to input a particular reference value needed for the detection of error values for feedback control. On the other hand, the data bytes 113, i.e., channel-encoded data, has no regularity. Therefore, to detect error values from the channel-encoded data, a reference value used for comparison is needed.

Figure 4:
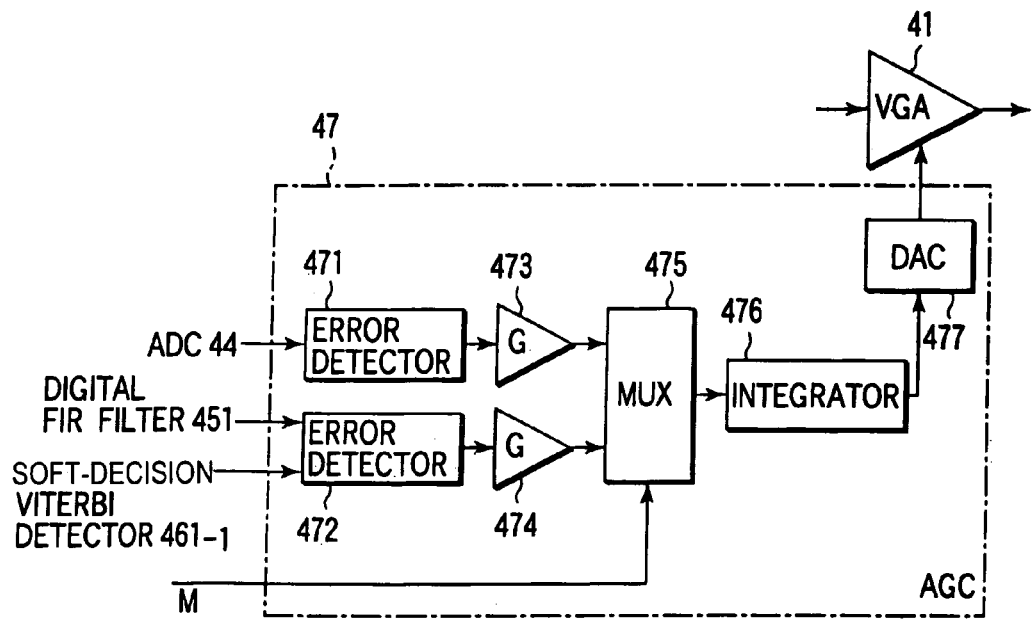
FIG. 4 is a block diagram illustrating the configuration of the AGC 47 appearing in FIG. 1.

FIG. 4 is a block diagram illustrating the configuration of the automatic gain controller (AGC) 47. As shown, the automatic gain controller 47 comprises error (gain error) detectors 471 and 472, amplifiers (G) 473 and 474, multiplexer (MUX) 475, integrator 476 and D/A (Digital/Analog) converter (DAC) 477. The error detector 471 detects error values in signal amplitude from the preamble pattern, utilizing the periodicity of the preamble pattern. The error detector 472 detects error values in signal amplitude from the channel-encoded data. In this embodiment, the error detector 472 detects error values in signal amplitude from the output of the FIR filter 451 (i.e., a PR-equalized sample value sequence), and the output of the soft-decision Viterbi detector 461-1 (i.e., soft-decision values) provided in the first-stage decoder unit 460-1 of the iterative decoder 46. The outputs of the error detectors 471 and 472 are input to the multiplexer 475 via the amplifiers 473 and 474, respectively. The multiplexer 475 selects, in an acquisition mode, the error signal input from the error detector 471 via the amplifier 473, and selects, in a tracking mode, the error signal input from the error detector 472 via the amplifier 474. The acquisition mode designates high-speed acquisition, utilizing the preamble pattern. The tracking mode designates moderate feedback control utilizing the data bytes 113. These modes are designated by mode signals M. The error signal selected by the multiplexer 475 is supplied to the variable gain controller 41 via the integrator 476 and D/A converter 477, where it is used to feedback-control the gain of the variable gain amplifier 41.

Figure 5:
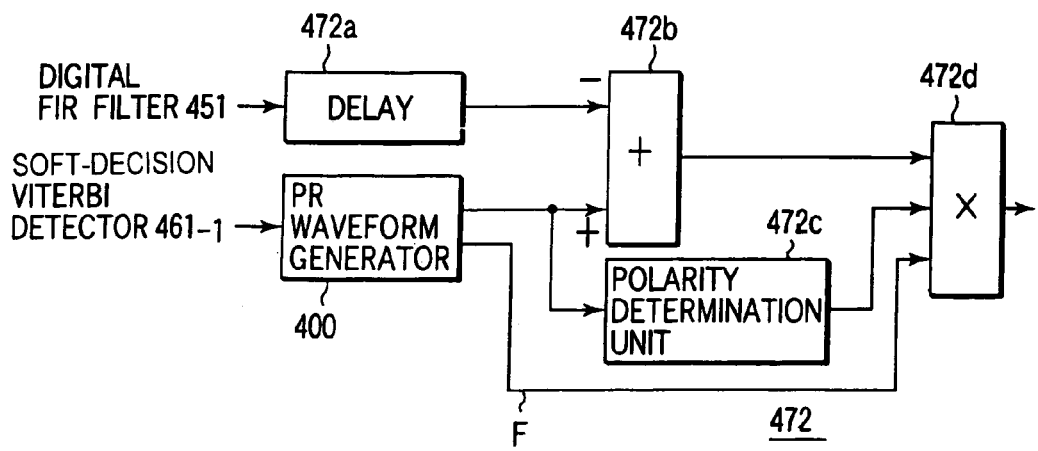
FIG. 5 is a block diagram illustrating the configuration of the error detector 472 appearing in FIG. 4.

FIG. 5 is a block diagram illustrating the configuration of the error detector 472 incorporated in the automatic gain controller 47 in FIG. 4. As shown, the error detector 472 comprises a PR waveform generator 400, delay circuit 472a, adder (+) 472b, polarity determination unit 472c and multiplier (×) 472d. In this embodiment, the output of the multiplier 472d is used as the output (error values) of the error detector 472.

The PR waveform generator 400 generates a digital value sequence of an expected PR equalization waveform (i.e., an expected PR value sequence) from the output from the soft-decision Viterbi detector 461-1 of the decoder unit 460-1. The PR waveform generator 400 also generates a flag (reliability flag) F. The flag F indicates whether the reliability of each value of the PR value sequence generated by the PR waveform generator 400 is high (F="1") or low (F="0"). As will be described later, an error detector 482 (see FIG. 9) incorporated in the offset controller 48, a phase comparator 492 (see FIG. 11) incorporated in the timing recovery controller 49, and an error detector 453 (see FIG. 13) incorporated in the tap coefficient controller 452 also incorporate respective PR waveform generators 400 similar to the above-mentioned generator 400.

The delay circuit 472a delays the output of the FIR filter 451 by a predetermined time. This delay time is set equal to the time period required from the time when a sample value sequence is output from the FIR filter 451, to the time when a corresponding sample value sequence is output from the soft-decision Viterbi detector 461-1 of the decoder unit 460-1. As a result, the delay time of the output of the FIR filter 451 is identical to that of an expected PR value sequence generated by the PR waveform generator 400. The adder 472b has a positive-side input (+) and negative-side input (−). The output of the PR waveform generator 400 is input to the positive-side input of the adder 472b, while the output of the delay circuit 472a is input to the negative-side input of the adder 472b. Thus, the adder 472b adds a PR value sequence output from the PR waveform generator 400, to a sequence that is obtained by inverting the polarity of each sample value of a sample value sequence output from the delay circuit 472a. As apparent, the output of the adder 472b indicates the results of comparison between the amplitude of an expected PR equalization waveform based on the output of the soft-decision Viterbi detector 461-1, and the amplitudes of an actual PR equalization waveform represented by the output of the FIR filter 451. In other words, the results indicate error values in the amplitude of the actual PR equalization waveform.

The output of the PR waveform generator 400 is also input to the polarity determination unit 472c. The polarity determination unit 472c determines the polarity of each PR value of the expected PR value sequence output from the PR waveform generator 400. If each PR value is positive, the polarity determination unit 472c generates "+1". If each PR value is negative, the unit 472c generates "−1". Further, if each PR value is neither positive nor negative, i.e., 0, the unit 472c generates "0". The outputs of the adder 472b and polarity determination unit 472c, and the reliability flag F output from the PR waveform generator 400 are input to the multiplier 472d. The multiplier 472d multiplies the outputs of the adder 472b and polarity determination unit 472c, and the reliability flag F from the PR waveform generator 400 together, thereby obtaining error values in signal amplitude from channel-encoded data of no regularity. When the reliability flag F is "0", the reliability of a PR value sequence output from the PR waveform generator 400 is low. In light of this, in the embodiment, the multiplier 472d multiplies the outputs of the adder 472b and polarity determination unit 472c, and the reliability flag F together, as described above. If the reliability flag F is "0", the output of the multiplier 472d (i.e., the output of the error detector 472) is 0 regardless of the error value indicated by the output of the adder 472b. Thus, the multiplier 472d functions as an error output controller for preventing an error value of a low reliability from being used for feedback control. The same can be said of multiplier 482d, 492d and 453d.

Figure 6:
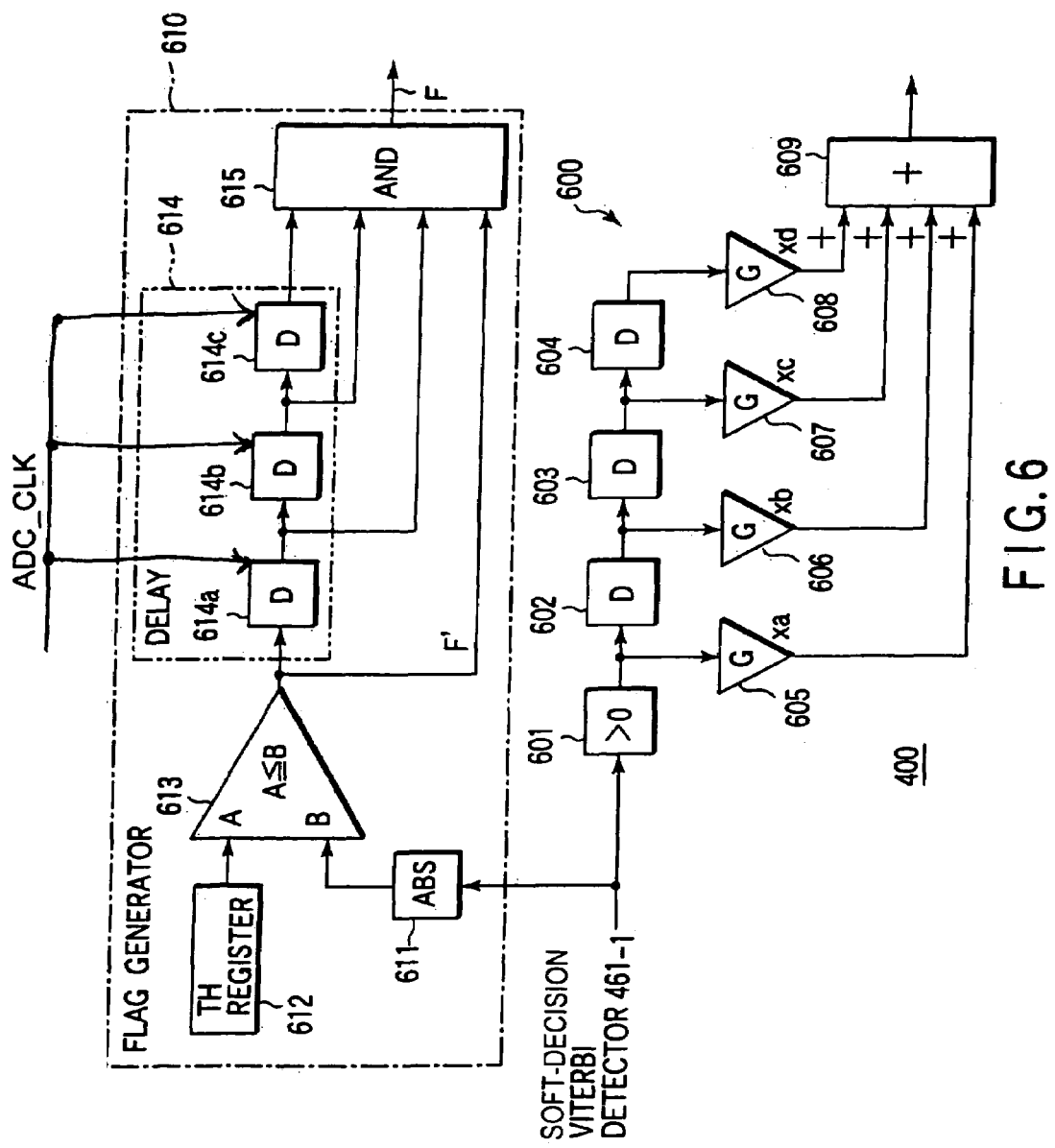
FIG. 6 is a block diagram illustrating the configuration of each PR waveform generator 400 appearing in FIG. 1.

FIG. 6 is a block diagram illustrating the configuration of the PR waveform generator 400. In the PR waveform generator 400 shown in FIG. 6, the output of the soft-decision Viterbi detector 461-1 of the decoder unit 460-1, i.e., soft-decision value sequence, is input to a comparator 601. The comparator 601 compares each soft-decision value of the input soft-decision value sequence with 0, thereby determining whether or not each soft-decision value exceeds 0 (i.e., determining the polarity of each soft-decision value). This determination is equivalent to the hard decision of each soft-decision value. In other words, the comparator 601 is a hard-decision unit that outputs "1" if each soft-decision value exceeds 0, and outputs "0" if each soft-decision value does not exceed 0.

The output (binary sequence) of the comparator 601 is input to a first-stage delay element 602 included in a plurality of, for example, three cascade-connected delay elements (D) 602, 603 and 604. In this embodiment, PR parameters a, b, c and d are employed, and the constraint length n (i.e., the number n of clock pulses indicating the range which the influence of PR covers) is 4. In this case, the number of delay elements connected by cascade connection, which include the delay element receiving the output of the comparator 601, is n−1=4−1 =3, as described above. The delay elements 602, 603 and 604 are flip-flops that operate in synchrony with the sampling clock ADC_CLK to thereby hold each binary value of the binary sequence input thereto for one period (one sampling period) of the sampling clock ADC_CLK. Accordingly, the output of the comparator 601 is sequentially delayed by the delay elements 602, 603 and 604 in units of sampling periods of the sampling clock ADC_CLK. The output of the comparator 601 is also input to a multiplier (G) 605. The outputs of the delay elements 602, 603 and 604 are input to multipliers (G) 606, 607 and 608, respectively. It is apparent that the outputs of the delay elements 602, 603 and 604 are obtained by delaying the output of the comparator 601 by one period, two periods and three periods of the sampling clock ADC_CLK, respectively.

The multipliers 605, 606, 607 and 608 multiply each binary value ("1" or "0") of the input binary sequence by a, b, c and d, respectively. The outputs of the multipliers 605, 606, 607 and 608 are added together by an adder 609. It is apparent that the delay elements 602, 603 and 604, multipliers 605, 606, 607 and 608 and adder 609 realize a system (convolution integrator) 600 for executing convolution integration of the binary sequence output from the comparator 601 and PR values represented by predetermined parameters a, b, c and d. The convolution integrator 600 is an ideal PR system equivalent to the FIR filter 451. The output of the adder 609 represents an expected PR value sequence corresponding to the binary sequence output from the comparator 601. In other words, the binary sequence corresponding to the output (soft-decision values) of the soft-decision Viterbi detector 461-1 in the decoder unit 460-1 is converted into an expected PR value sequence by the PR waveform generator 400.

The PR waveform generator 400 incorporates a flag generator 610. The flag generator 610 generates a reliability flag F that indicates whether the reliability of the expected PR value sequence generated by the PR waveform generator 400 is high or low. The flag generator 610 comprises an absolute value converter 611, threshold (TH) register 612, comparator 613, delay circuit 614 and AND gate 615. The output (soft-decision values) of the soft-decision Viterbi detector 461-1 in the decoder unit 460-1 is input to the absolute value converter 611 of the flag generator 610, as well as to the comparator 601. The absolute value converter 611 converts, into an absolute value, a soft-decision value output from the soft-decision Viterbi detector 461-1. The output of the absolute value converter 601 is input to the comparator 613, together with a value held in the threshold register 612. The comparator 613 compares the output of the absolute value converter 601 with the value of the threshold register 612. As is well known, the closer to 0 the absolute value of the output of the soft-decision Viterbi detector 461-1 is, the lower its reliability. In light of this, if the output of the absolute value converter 611 (i.e., the absolute value of the output of the soft-decision Viterbi detector 461-1) is lower than the value (threshold value) of the threshold register 612, the comparator 613 outputs a flag F' indicative of "0" to show that the output of the soft-decision Viterbi detector 461-1 is unreliable. On the other hand, if the absolute value of the output of the soft-decision Viterbi detector 461-1 is equal to or higher than the value of the threshold register 612, the comparator 613 outputs a flag F' indicative of "1" to show that the output of the soft-decision Viterbi detector 461-1 is reliable.

As mentioned above, the PR parameters are a, b, c and d, and the constraint length n is 4. In this case, the influence of the bit determined to be unreliable by the comparator 613 lingers over three periods (n−1=4−1=3) of the sampling clock ACD_CLK, i.e., three sampling periods. In light of this, in the embodiment, if the comparator 613 determines that the output is unreliable, the flag F' is maintained at "0" for three sampling periods to show that the reliability of the PR value sequence is low during these periods. To this end, the delay circuit 614 comprises three (n−1) cascade-connected delay elements (D) 614a, 614b and 614c. The output (flag F') of the comparator 613 is input to the first-stage delay element 614a. The delay elements 614a, 614b and 614c are flip-flops that operate in synchrony with the sampling clock ADC_CLK to thereby hold each binary value of the binary sequence input thereto for one period (one sampling period) of the sampling clock ADC_CLK. The outputs of the delay elements 614a, 614b and 614c are obtained by delaying the output of the comparator 613 by one period, two periods and three periods of the sampling clock ADC_CLK, respectively. The outputs of the delay elements 614a, 614b and 614c are input to the AND gate 615, together with the output (flag F') of the comparator 613. The AND gate 615 provides the logical product of the output of the comparator 613 and each of the outputs of the delay elements 614a, 614b and 614c. The output of the AND gate 615 is used as the reliability flag F. Therefore, to indicate that the output of the soft-decision Viterbi detector 461-1 is unreliable, when the output (flag F') of the comparator 613 is "0", the flag F as the output of the AND gate 615 stays at "0", indicative of low reliability, for three sampling periods (=(n−1) sampling periods). Thus, the AND gate 615 functions as a flag-setting unit for setting the state ("1" or "0") of the reliability flag F in accordance with the output of comparator 613 and each output of the delay elements 614a, 614b and 614c.

The value held in the threshold register 612 can be rewritten by, for example, a control MPU (microprocessor unit), not shown. A predetermined threshold value is set in the threshold register 612 at the stage of initializing the read/write IC 20 by the MPU in accordance with a control program (software). As is apparent, if "0" is set as a threshold value in the threshold register 612, the reliability flag F is always "1". In the embodiment, the PR waveform generator 400 incorporates the flag generator 610. However, the flag generator 610 may be provided independently of the PR waveform generator 400.

Figure 7:
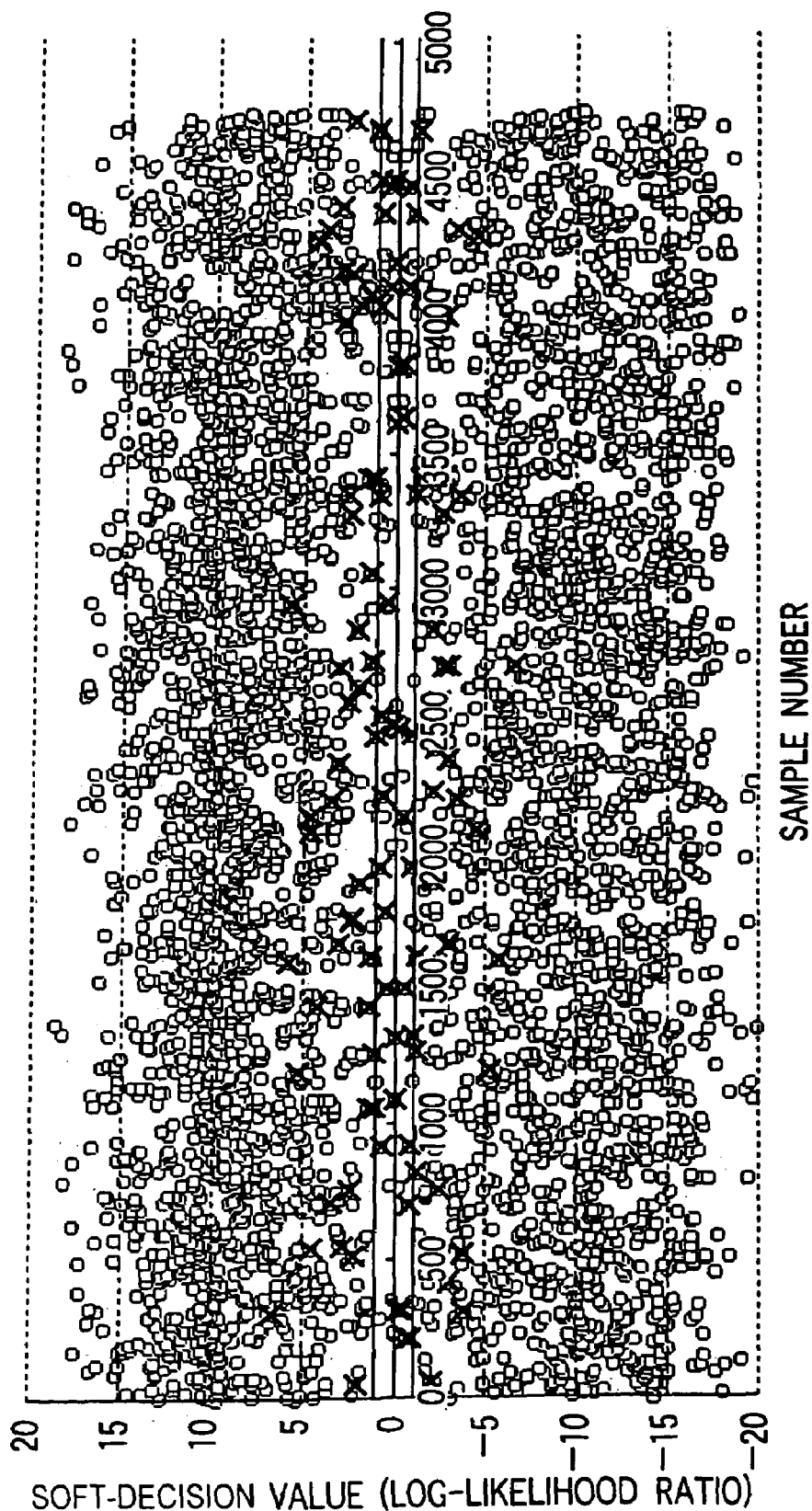
FIG. 7 illustrates a large number of signal sample points as examples of soft-decision values indicative of the outputs of the soft-decision Viterbi detector 461-1 appearing in FIG. 1.

FIG. 7 is a view illustrating examples of soft-decision values (soft-decision output values indicative of reliability) as the outputs of the soft-decision Viterbi detector 461-1 of the first-stage decoder unit 460-1. In FIG. 7, the X axis (abscissa) indicates a sample number assigned to each sample (sample point) of a sample value sequence, while the Y axis (ordinate) indicates a soft-decision value (log-likelihood ratio) at each sample (sample point). The sample point at which the soft-decision value is 0 is where the same probability is obtained, regardless of whether the soft-decision value is considered to be +1 or −1. This means that the reliability of the soft-decision value of 0 is lowest. The greater the absolute value of a negative or positive soft-decision value, the higher the reliability of the decision result. As mentioned above, FIG. 7 shows output samples of the soft-decision Viterbi detector 461-1 of the first-stage decoder unit 460-1, therefore there are many samples of low soft-decision values (log-likelihood ratios). However, as the number of occasions of iteration of decoding increases, the reliability of the decision results is enhanced (i.e., the log-likelihood ratio increases). Therefore, as the number of occasions of iteration of decoding increases, the sample points are separated into upper and lower portions of the graph. The sample values of the sample value sequences output from the soft-decision Viterbi detectors 461-2 and 461-3 of the decoder units 460-2 and 460-3 correspond to the soft-decision values at sample points separated into the upper and lower portions of the graph.

In FIG. 7, the sample points plotted by the square marks are points at which the results of hard-decision as to whether the log-likelihood ratio is positive or negative, i.e., higher or lower than a threshold value of 0, were correct. On the other hand, the sample points plotted by the x-marks are points at which the results of the hard-decision were incorrect. As is evident from FIG. 7, the sample points indicated by the x-marks have low log-likelihood ratios. Further, among the sample points at which the log-likelihood ratio is low, the ratio of the sample points that indicate the results of the hard-decision were incorrect (i.e., the sample points indicated by the x-marks), to the sample points that indicate the results of the hard-decision were correct (i.e., the sample points indicated by the square marks) is extremely high. In FIG. 7, 95% of the sample points indicated by the x-marks (indicating the hard-decision values were incorrect), had a log-likelihood ratio is lower than 5. Accordingly, when the sample value sequence shown in FIG. 7 is input to the PR waveform generator 400 having the configuration of FIG. 6, if the value of the threshold register 612 is set to 5, 95% of the incorrect decision values can be eliminated, with a sufficient number of correct decision values held.

Figure 8:
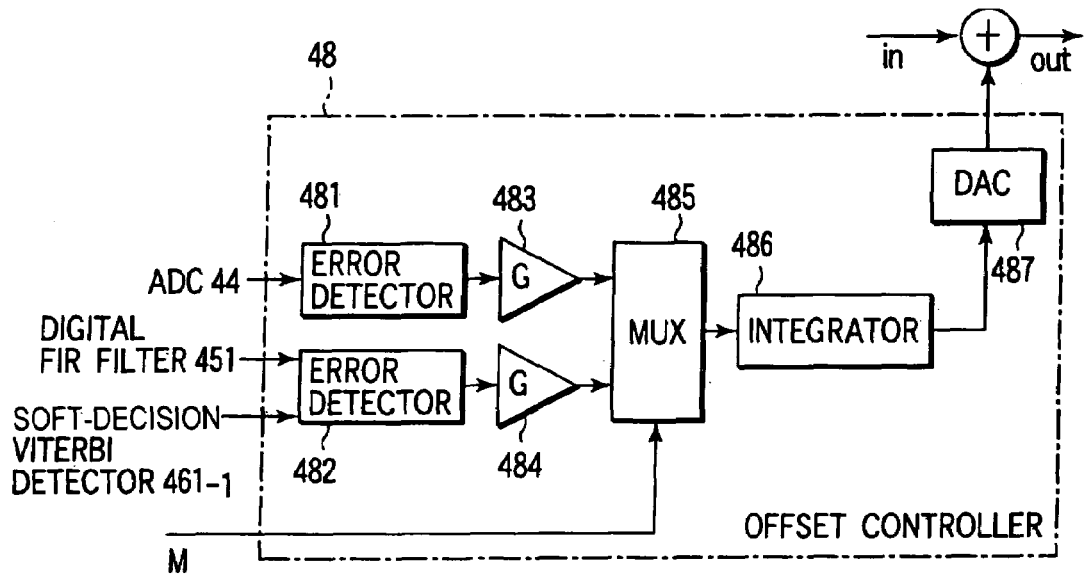
FIG. 8 is a block diagram illustrating the configuration of the offset controller 48 appearing in FIG. 1.

FIG. 8 is a block diagram illustrating the configuration of the offset controller 48 appearing in FIG. 1. The offset controller 48 has the same configuration as the automatic gain controller 47 shown in FIG. 4. Specifically, the offset controller 48 comprises error detectors 481 and 482, amplifiers (G) 483 and 484, multiplexer (MUX) 485, integrator 486 and D/A converter (DAC) 487, which correspond to the error detectors 471 and 472, amplifiers (G) 473 and 474, multiplexer (MUX) 475, integrator 476 and D/A converter (DAC) 477, respectively. However, the error detector 482 differs from the error detector 472 of the automatic gain controller 47. The error detector 482 detects offset errors, instead of detecting error values in amplitude from channel-encoded data.

Figure 9:
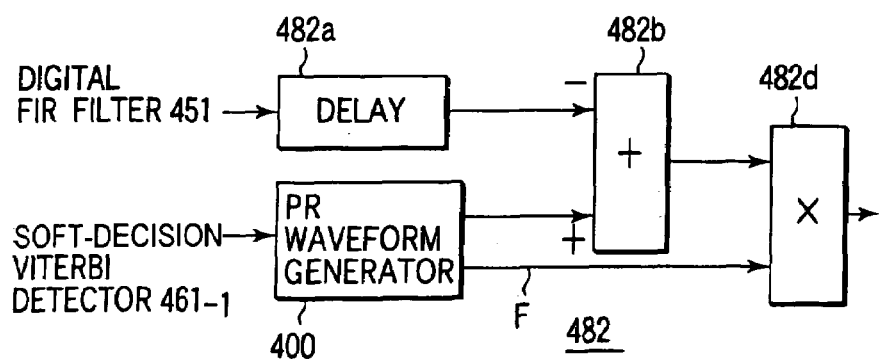
FIG. 9 is a block diagram illustrating the configuration of the error detector 482 appearing in FIG. 8.

FIG. 9 is a block diagram illustrating the configuration of the error detector 482 of the offset controller 48 of FIG. 8. The error detector 482 incorporates a PR waveform generator 400 having the same configuration as that shown in FIG. 6. The error detector 482 also incorporates a delay circuit 482a, adder 482b and multiplier 482d that correspond to the delay circuit 472a, adder 472b and multiplier 472d shown in FIG. 5, respectively. The adder 482b adds a PR value sequence output from the PR waveform generator 400, to a sequence that is obtained by inverting the polarity of each sample value of the output (sample value sequence) of the FIR filter 451 delayed by the delay circuit 482a. The multiplier 482d multiplies the output of the adder 482b by a reliability flag F (the flag F is output from the PR waveform generator 400 together with the PR value sequence), thereby preventing error values of low reliability from being output.

The error detector 482 of the offset controller 48 differs from the error detector 472 of the automatic gain controller 47 in that the former does not have an element corresponding to the polarity determining unit 472c. In the error detector 472 of the automatic gain controller 47, to detect error values in signal amplitude from channel-encoded data, the amount of deviation from the center level of a reproduction waveform is estimated. On the other hand, in the error detector 482 of the offset controller 48, to detect offset errors from channel-encoded data, the amount of deviation of the entire waveform is estimated.

FIG. 10 is a block diagram illustrating the configuration of the timing recovery controller 49 appearing in FIG. 1. The timing recovery controller 49 is realized by a timing loop controller that incorporates a voltage-controlled oscillator. Specifically, the timing recovery controller 49 comprises a phase comparator 491 for an acquisition mode, phase comparator 492 for a tracking mode, multiplexer (MUX) 493, loop filter 494 and voltage-controlled oscillator (VCO) 495. The phase comparator 491 detects a phase error between a waveform sampled from a preamble pattern and the channel clock, on the basis of the output (sample value sequence) of the A/D converter 44. The phase comparator 492 detects a phase error between a waveform sampled from channel-encoded data and the channel clock, on the basis of the output (PR equalized sample values) of the FIR filter 451 and the output (soft-decision values) of the soft-decision Viterbi detector 461-1 in the decoder unit 460-1.

The multiplexer 493 selects an error signal output from the phase comparator 491 if the acquisition mode is designated by a mode signal M, and selects an error signal output from the phase comparator 492 if the tracking mode is designated by the mode signal M. The selected error signal (phase error value) is input to the VCO 495 via the loop filter 494, and used for frequency and phase control performed by the VCO 495. The VCO 495 is dynamically controlled by the error signal selected by the multiplexer 493 (i.e., the phase error value detected by the phase comparator 491 or 492). As a result, the VCO 495 generates the sampling clock ADC_CLK synchronous with the channel clock.

Figure 11:
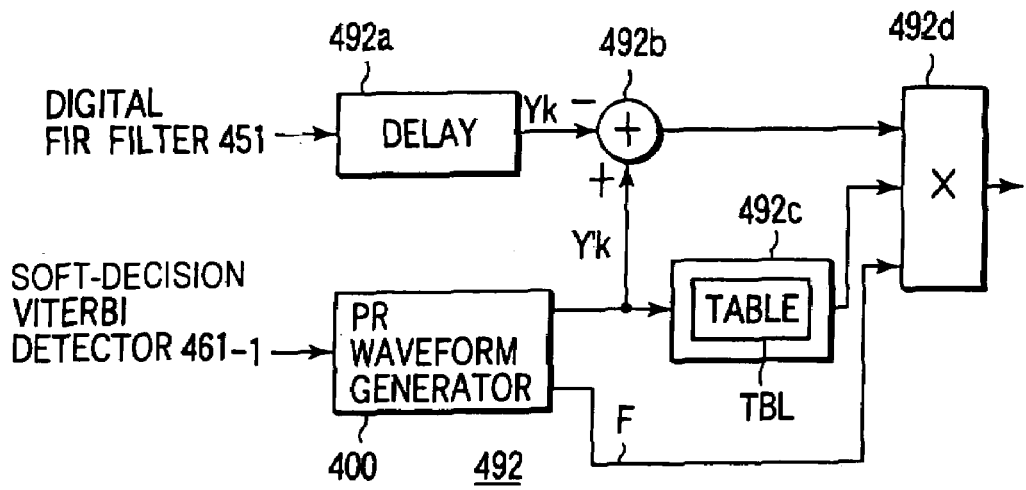
FIG. 11 is a block diagram illustrating the configuration of the phase comparator 492 appearing in FIG. 10.

FIG. 11 is a block diagram illustrating the configuration of the phase comparator 492 of the timing recovery controller 49 of FIG. 10. The phase comparator 492 comprises a PR waveform generator 400 having the same configuration as that shown in FIG. 6. The phase comparator 492 also comprises a delay circuit 492a and adder 492b that correspond to the delay circuit 472a and adder 472b shown in FIG. 5, respectively. The phase comparator 492 further comprises a gradient predictor 492c and multiplier 492d. The delay circuit 492a delays the output of the FIR filter 451 by a predetermined time period. In a manner similar to the case of the delay circuit 472a, the delay time is set equal to the time period required from the time when a sample value sequence is output from the FIR filter 451, to the time when a corresponding sample value sequence is output from the soft-decision Viterbi detector 461-1 of the decoder unit 460-1.

As described above, the PR waveform generator 400 generates an expected PR value sequence on the basis of the output of the soft-decision Viterbi detector 461-1. The adder 492b adds a PR value sequence output from the PR waveform generator 400, to a sequence that is obtained by inverting the polarity of each sample value of a sample value sequence output from the delay circuit 492a. The output of the adder 492b indicates the results of comparison between the amplitude of an expected PR equalization waveform and the amplitudes of an actual PR equalization waveform. In other words, the results indicate error values in the amplitude of the actual PR equalization waveform. The outputs of the FIR filter 451 and soft-decision Viterbi detector 461-1, input to the phase comparator 492, correspond to a sample value sequence obtained after A/D conversion by the A/D converter 44. Accordingly, the output of the adder 492b corresponding to each sample value indicates an error value in amplitude (amplitude error). This means that the phase comparator 492 cannot directly detect a deviation (error) in the direction of time (phase). Accordingly, the phase comparator 492 predicts a waveform gradient at a sample point at which an amplitude error is obtained, and converts an error value in signal amplitude into an error value in phase on the basis of the prediction result. The prediction of gradient is performed by the gradient predictor 492c in the following manner.

Firstly, an expected PR value sequence as the output of the PR waveform generator 400 is input to the gradient predictor 492c. The gradient predictor 492c incorporates a number n of delay elements (not shown) connected by cascade connection. The gradient predictor 492c holds amplitude values at a number n of continuous sample points, using the number n of delay elements. The gradient predictor 492c predicts a waveform gradient from the amplitude values at the number n of continuous sample points and the amplitude value at the next sample point (i.e., from the amplitude values obtained at a number (n+1) of continuous sample points). In this embodiment, the gradient predictor 492c has a table TBL showing the relationship between combinations of amplitudes at the number (n+1) of sample points and gradients. At each sample point of an expected PR equalized waveform as the output of the PR waveform generator 400, the gradient predictor 492c acquires, in synchrony with the sampling clock ADC_CLK, the amplitude values obtained at the number (n+1) of continuous sample points including said each sample point. Referring to the table TBL showing the combination of amplitudes at the number (n+1) of sample points, the gradient predictor 492c acquires a predicted waveform gradient at each sample point.

The multiplier 492d multiplies, together, the output (amplitude error) of the adder 492b, a predicted waveform gradient acquired at each sample point by the gradient predictor 492c, and a reliability flag F output from the PR waveform generator 400 together with an expected PR value sequence. As a result of this multiplication, the multiplier 492d acquires a phase error in a waveform sampled from channel-encoded data, with respect to the channel clock. Further, the multiplication of an amplitude error, waveform gradient and reliability flag F by the multiplier 492d prevents error values of low reliability from being output during the time when the reliability flag F is "0" (i.e., during the time when the reliability of the soft-decision value input to the PR waveform generator 400 is low).

Figure 12:
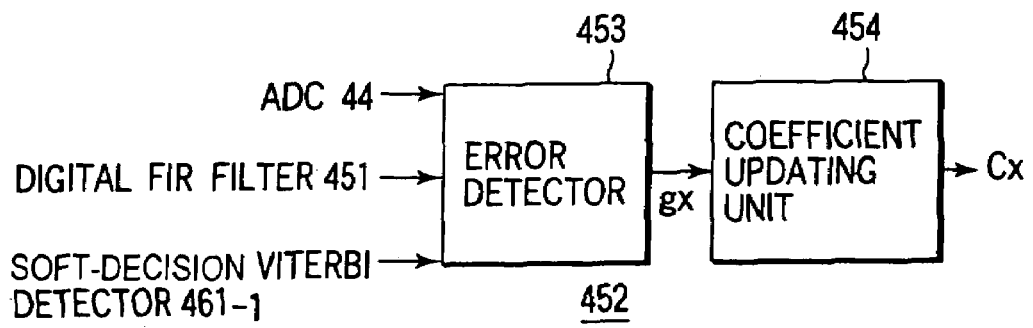
FIG. 12 is a block diagram illustrating the configuration of the tap coefficient controller 452 appearing in FIG. 1.

FIG. 12 is a block diagram illustrating the configuration of the tap coefficient controller 452. The tap coefficient controller 452 performs feedback control for adaptive control of the equalization characteristic of the FIR filter 451. This feedback control is realized by updating the tap coefficient of the FIR filter 451, using the outputs of the A/D converter 44, FIR filter 451 and soft-decision Viterbi detector 461-1. For facilitating the description, assume that the number of taps employed in the FIR filter 451 is 12. In feedback control performed on the FIR filter 451 by the tap coefficient controller 452, high-speed acquisition of a read signal using a preamble pattern is not performed, unlike the above-described feedback control by the automatic gain controller 47, offset controller 48 and timing recovery controller 49. This is because the use of a simple pattern, such as a preamble pattern, makes it impossible to finish a tap coefficient updating operation, and may cause the tap coefficient to drift to an incorrect value.

The tap coefficient controller 452 comprises an error detector 453 and coefficient-updating unit 454. The error detector 453 detects errors in tap coefficients. The coefficient-updating unit 454 updates the tap coefficients of the FIR filter 451 on the basis of errors in the tap coefficients detected by the error detector 453, using a coefficient-updating algorithm called a "minimum mean square (LMS) method".

Figure 13:
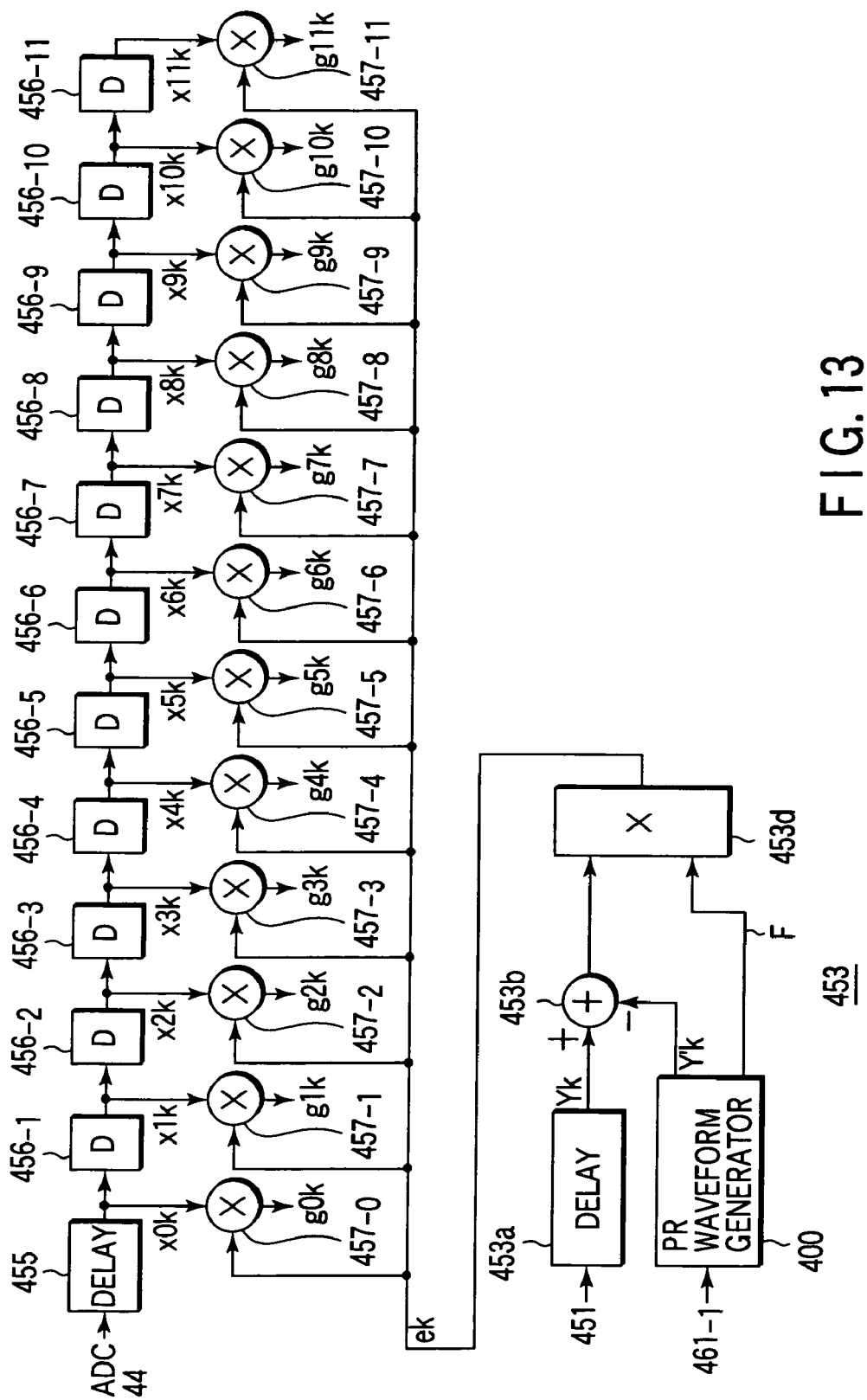
FIG. 13 is a block diagram illustrating the configuration of the error detector 453 appearing in FIG. 12.

FIG. 13 is a block diagram illustrating the configuration of the error detector 453 of the tap coefficient controller 452 shown in FIG. 12. As shown, the error detector 453 comprises a PR waveform generator 400 having the same configuration as that shown in FIG. 6. The error detector 453 also comprises a delay circuit 453a, adder 453b and multiplier 453d, that correspond to the delay circuit 482a, adder 482b and multiplier 482d shown in FIG. 9, respectively. The error detector 453 further comprises a delay circuit 455, eleven delay elements 456-1 to 456-11 connected by cascade connection, and twelve multipliers 457-1 to 457-11. The delay elements 456-1 to 456-11 are flip-flop-flops that operate in synchrony with, for example, the sampling clock ADC_CLK.

The delay circuit 453a delays the output of the FIR filter 451 by a predetermined time period. In a manner similar to the delay circuit 472a, the delay time is set equal to the time period required from the time when a sample value sequence is output from the FIR filter 451, to the time when a corresponding sample value sequence is output from the soft-decision Viterbi detector 461-1 of the decoder unit 460-1. The adder 453b adds a PR value sequence output from the PR waveform generator 400, to a sequence that is obtained by inverting the polarity of each sample value of a sample value sequence output from the delay circuit 453a. The output of the adder 453b indicates the results of comparison between the amplitude of an expected PR equalization waveform and the amplitudes of an actual PR equalization waveform. The multiplier 453d multiplies the output (error value) of the adder 452b by a reliability flag F (the flag F is output from the PR waveform generator 400 together with the PR value sequence), thereby preventing error values of low reliability from being output.

On the other hand, the output of the A/D converter 44 is delayed by the delay circuit 455 by the time required after the A/D converter 44 has output a sample value sequence until the soft-decision Viterbi detector 461-1 outputs a corresponding sample value sequence. As a result, the delay time of the output (sample value sequence) of A/D converter 44 is adjusted to that of an expected PR value sequence generated by the PR waveform generator 400. The output of the delay circuit 455 is sequentially delayed by eleven delay elements 456-1 to 456-11 in synchrony with the sampling clock ADC_CLK. The multiplier 457-0 computes the product g0k of the output x0k of the delay circuit 455 and the output ek of the multiplier 453d in synchrony with the sampling clock ADC_CLK. The multipliers 457-1 to 457-11 compute the products g1k to g11k of the outputs x1k to x11k of the delay circuits 456-1 to 456-11 and the output ek of the multiplier 453d, respectively. The products g0k to g11k represent errors in respective tap coefficients. The coefficient-updating unit 454 shown in FIG. 12 updates the tap coefficients Cx (C0 to C11) of the FIR filter 451 on the basis of the errors gx (g0k to g11k).

In the above-described embodiment, the automatic gain controller 47, offset controller 48, timing recovery controller 49 and tap coefficient controller 452 incorporate respective PR waveform generators 400. Each PR waveform generator 400 generates an expected PR value sequence on the basis of the output of the soft-decision Viterbi detector 461-1 of the first-stage decoder unit 460-1 in the iterative decoder 46. Using the respective PR waveform generators 400, the automatic gain controller 47, offset controller 48, timing recovery controller 49 and tap coefficient controller 452 perform feedback control for adjustment of the gain of the variable gain amplifier 41, offset compensation of the offset compensator 43, timing recovery of the sampling clock ADC_CLK and adaptive control of the FIR filter 451, respectively. Thus, the embodiment utilizes the output of the soft-decision Viterbi detector 461-1 of the first-stage decoder unit 460-1 whose delay time is shortest among the decoder units 460-1 to 460-3 of the iterative decoder 46. By virtue of this, the read channel 40 (signal processing device) that utilizes iterative decoding and hence needs an extremely long delay time to output binary data (hard-decision values) obtains the advantage that the delay time due to a feedback loop is reduced to that required for computing the log-likelihood ratio. The time needed for computing the log-likelihood ratio is therefore much shorter than the time required up to output of binary data. Therefore, a significant increase in the delay time due to a feedback loop can be avoided.

Further, in the read channel 40 utilizing iterative decoding, according to the embodiment, the PR waveform generator 400 generates an expected PR value sequence (i.e., a digital value sequence indicative of a reference PR waveform for an error value detection) and a reliability flag F that is information indicative of the reliability of the PR value sequence, thereby controlling the output of an error signal on the basis of the flag F. As a result, even the read channel 40, in which the S/N ratio of a signal input to the soft-decision Viterbi detector 461-1 of the iterative decoder 46 is low, can suppress erroneous detection of error values and obtain a sufficient feedback loop gain.

Furthermore, in the embodiment, the output of the soft-decision Viterbi detector 461-1 can be used for feedback control simply by adding the comparator 601, absolute value converter 611, threshold register 612, comparator 613, delay circuit 614 and AND gate 615.

To perform feedback control in a digital signal processing system utilizing PRML detection, it is sufficient if an expected signal amplitude is compared with the amplitude of each sample (discrete-time sample value) obtained by sampling an actual read signal, and the difference therebetween is converted into an error value. Thus, the thus-obtained error value enables feedback control other than that for the above-mentioned gain adjustment, offset compensation, timing recovery and adaptive control of the FIR filter 451. For example, also in feedback control for correcting the vertical asymmetry of a signal waveform due to non-linear distortion, digital data of a PR waveform (PR value sequence) generated by the PR waveform generator 400 employed in the embodiment can be used as digital data of a reference PR waveform.

The present invention is applied to a magnetic disk drive (HDD). However, it is also applicable to various disk drives that use, as a recording medium, a disk medium such as a magneto-optical disk, optical disk, etc.

What is claimed is:

1. A signal processing device utilizing partial response maximum likelihood detection, comprising:
    an iterative decoder which detects a signal from a partial response equalized sample value sequence, utilizing iterative decoding, the iterative decoder having a plurality of cascade-connected decoder units, each of the decoder units including a soft-decision Viterbi detector which outputs soft-decision values from a sample value sequence input to each of the decoder units;
    a partial response waveform generator which generates a digital value sequence of an expected partial response waveform based on an output of the soft-decision Viterbi detector included in a predetermined one of the decoder units, the predetermined decoder unit being other than a final-stage decoder unit;
    a flag generator which generates flag information indicative of whether reliability of the digital value sequence generated by the partial response waveform generator is low or high, based on the output of the soft-decision Viterbi detector included in the predetermined decoder unit;
    an error detector which detects error values in the partial response equalized sample value sequence, the error detector utilizing the digital value sequence generated by the partial response waveform generator, as a digital value sequence of a reference waveform for feedback control of a predetermined control target, the reference waveform being referred to for error value detection; and
    an error output controller which controls output of the error values detected by the error detector in accordance with a state of the flag information generated by the flag generator.

2. The signal processing device according to claim 1, wherein the predetermined decoder unit is a first-stage decoder unit included in the plurality of decoder units.

3. The signal processing device according to claim 1, wherein the flag generator includes:
    an absolute value converter which converts, into an absolute value, a soft-decision value output from the soft-decision Viterbi detector included in the predetermined decoder unit;
    a comparator which compares an output of the absolute value converter with a predetermined threshold value; and
    a flag setting unit which sets a state of the flag information in accordance with a comparison result of the comparator.

4. The signal processing device according to claim 3, wherein:
    the flag generator further includes a delay circuit which delays the comparison result of the comparator by one of one sampling period to a number (n−1) of sampling periods, n indicating a sampling period in which influence of the partial response equalized sample value sequence exerts; and
    the flag setting unit sets the flag information in a particular state indicating that the reliability of the digital value sequence generated by the partial response waveform generator is low, during a period in which at least one of the comparison result of the comparator and an output of the delay circuit indicates that the output of the absolute value converter is lower than the threshold value, the output of the delay circuit being generated during the one of the one sampling period to the number (n−1) of sampling periods.

5. The signal processing device according to claim 4, wherein the delay circuit includes a number (n−1) of delay elements connected by cascade connection, a first-stage one of the number (n−1) of delay elements having an input terminal connected to an output terminal of the comparator, the number (n−1) of delay elements delaying respective inputs by one sampling period.

6. The signal processing device according to claim 5, wherein the number (n−1) of delay elements are flip-flops which hold their respective inputs for one sampling period in synchrony with a sampling clock.

7. The signal processing device according to claim 1, wherein the partial response waveform generator includes:
    a hard-decision unit which binarizes a soft-decision value output from the soft-decision Viterbi detector included in the predetermined decoder unit, in accordance with polarity of the soft-decision value, thereby outputting a binary sequence; and
    a convolution integrator which executes convolution integration of the binary sequence output from the hard-decision unit and predetermined partial response values, the convolution integrator outputs a result of the convolution integration as a digital value sequence of an expected partial response waveform.

8. The signal processing device according to claim 7, wherein the convolution integrator includes:

a number (n−1) of delay elements connected by cascade connection, a first-stage one of the number (n−1) of delay elements having an input terminal connected to an output terminal of the hard-decision unit, the number (n−1) of delay elements delaying respective inputs by one sampling period;

a first multiplier which multiplies an output of the hard-decision unit by a predetermined parameter value;

a number (n−1) of second multipliers which multiply outputs of the number (n−1) of delay elements by respective parameter values uniquely assigned to the number (n−1) of delay elements; and an adder which adds an output of the first multiplier and outputs of the number (n−1) of second multipliers.

9. The signal processing device according to claim 1, wherein the error output controller sets a to-be-output error value to a value lower than a detection result of the error detector, during a period in which the flag information generated by the flag generator indicates that the reliability of the digital value sequence generated by the partial response waveform generator is low.

10. The signal processing device according to claim 1, wherein the error output controller sets a to-be-output error value to 0, regardless of a detection result of the error detector, during a period in which the flag information generated by the flag generator indicates that the reliability of the digital value sequence generated by the partial response waveform generator is low.

11. The signal processing device according to claim 1, wherein one of a signal gain, a signal offset, asymmetry of a signal waveform, timing recovery is the control target subjected to feedback control based on the error values whose output is controlled by the error output controller.

12. The signal processing device according to claim 1, further comprising:

a variable gain amplifier which adjusts an amplitude of a read analog signal;

an analog filter which filters an analog signal output from the variable gain amplifier;

an offset compensator which receives the analog signal filtered by the analog filter and compensates an offset of the analog signal;

an A/D converter which converts an analog signal, output from the offset compensator, into a quantized discrete-time sample value sequence in synchrony with a sampling clock;

a digital filter which equalizes the quantized discrete-time sample value sequence output from the A/D converter in a desired response direction, and outputs a partial response equalized sample value sequence;

an automatic gain controller which feedback-controls a gain of the variable gain amplifier such that the variable gain amplifier maintains the amplitude of the read analog signal constant;

an offset controller which feedback-controls offset compensation by the offset compensator;

a timing recovery controller which feedback-controls timing of the sampling clock used for sampling by the A/D converter; and an equalized characteristic controller which feedback-controls an equalized characteristic of the digital filter, wherein at least one of the automatic gain controller, the offset controller, the timing recovery controller and the equalized characteristic controller includes a combination of the partial response waveform generator, the flag generator, the error detector and the error output controller.

13. The signal processing device according to claim 1, wherein the soft-decision Viterbi detector utilizes a soft-output Viterbi algorithm which computes, as soft-decision values, a logarithmic ratio of a posterior probability of an input sample value sequence.

14. A disk drive for writing and reading data to and from a disk, using a head, comprising:

a head amplifier which amplifies an analog signal read by the head; and a signal processing device which converts the analog signal, amplified by the head amplifier, into a partial response equalized sample value sequence, and decodes original data from the partial response equalized sample value sequence, the signal processing device including:

an iterative decoder which detects a signal from a partial response equalized sample value sequence, utilizing iterative decoding, the iterative decoder having a plurality of cascade-connected decoder units, each of the decoder units including a soft-decision Viterbi detector which outputs soft-decision values from a sample value sequence input to each of the decoder units;

a partial response waveform generator which generates a digital value sequence of an expected partial response waveform based on an output of the soft-decision Viterbi detector included in a predetermined one of the decoder units, the predetermined decoder unit being other than a final-stage decoder unit;

a flag generator which generates flag information indicative of whether reliability of the digital value sequence generated by the partial response waveform generator is low or high, based on the output of the soft-decision Viterbi detector included in the predetermined decoder unit;

an error detector which detects error values in the partial response equalized sample value sequence, the error detector utilizing the digital value sequence generated by the partial response waveform generator, as a digital value sequence of a reference waveform for feedback control of a predetermined control target, the reference waveform being referred to for error value detection; and an error output controller which controls output of the error values detected by the error detector in accordance with a state of the flag information generated by the flag generator.

15. A signal processing method for feedback control of a predetermined control target, for use in a disk drive which decodes data from a sample value sequence obtained by sampling an analog signal read from a disk, utilizing partial response maximum likelihood detection, the disk drive including an iterative decoder which detects a signal from a partial response equalized sample value sequence, utilizing iterative decoding, the iterative decoder having a plurality of cascade-connected decoder units, each of the decoder units including a soft-decision Viterbi detector which outputs soft-decision values from a sample value sequence input to each of the decoder units, the signal processing method comprising:

generating a digital value sequence of an expected partial response waveform based on an output of the soft-decision Viterbi detector included in a predetermined one of the decoder units, the predetermined decoder unit being other than a final-stage decoder unit;

generating flag information indicative of whether reliability of the digital value sequence of the expected partial response waveform is low or high, based on the output of the soft-decision Viterbi detector included in the predetermined decoder unit, generation of the flag information being parallel to generation of the digital value sequence;

detecting error values in the partial response equalized sample value sequence by utilizing the generated digital value sequence as a digital value sequence of a reference waveform used for feedback control of a predetermined control target; and controlling output of the detected error values in accordance with a state of the generated flag information.

* * * * *